United States Patent [19]

Zwarts

[11] Patent Number: 4,660,001
[45] Date of Patent: Apr. 21, 1987

[54] THREE-TERMINAL NEGATIVE ADMITTANCE NETWORK

[75] Inventor: Cornelis M. G. Zwarts, Gatineau, Canada

[73] Assignee: Canadian Patents and Development Limited, Ottawa, Canada

[21] Appl. No.: 725,998

[22] Filed: Apr. 22, 1985

[51] Int. Cl.$^4$ .............................................. H03B 5/08
[52] U.S. Cl. ................................. 331/115; 331/108 R; 331/117 R
[58] Field of Search ............... 331/108 R, 115, 117 R, 331/132, 135; 333/214, 217; 324/307

[56] References Cited

U.S. PATENT DOCUMENTS 3,639,858  2/1972  Miyata et al. ................. 331/115 X
4,507,622  3/1985  Muth ................................. 331/115

Primary Examiner—Eugene R. LaRoche
Assistant Examiner—Robert J. Pascal
Attorney, Agent, or Firm—Yoshiharu Toyooka

[57] ABSTRACT

Three-terminal negative admittance networks are disclosed. The preferred networks include either a bipolar junction transistor or a field-effect transistor phase shift mechanisms are used to generate a negative admittance. Various biasing schemes for proper operations of the network are also explained.

11 Claims, 25 Drawing Figures

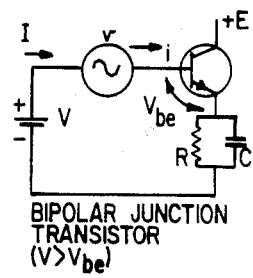
BIPOLAR JUNCTION
TRANSISTOR
($V > V_{be}$)
FIG. 17a
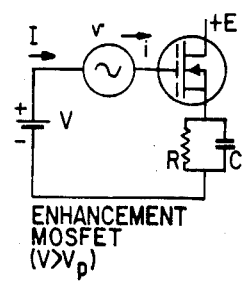
ENHANCEMENT
MOSFET
($V > V_p$)
FIG. 17b
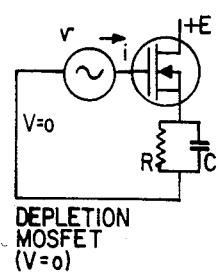
DEPLETION
MOSFET
($V = 0$)
FIG. 17c
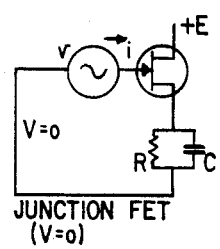
JUNCTION FET
($V = 0$)
FIG. 17d
FIG. 19a
FIG. 19b

THREE-TERMINAL NEGATIVE ADMITTANCE NETWORK

This invention relates to electrical networks and in particular to electrical networks including a transistor and exhibiting negative admittance characteristics to a high frequency AC signal.

BACKGROUND OF THE INVENTION

There have been a few patents which teach electronic circuit arrangements exhibiting negative resistance. U.S. Pat. No. 3,358,153, Dec. 12, 1967 (Poo), for example, uses a pair of bipolar transistors of the same conductivity to obtain two terminal negative resistance circuit. A positive feedback in the circuit produces a negative resistance which is essentially ohmic in nature, i.e. an equal negative resistance being developed for very low as well as high frequencies. Its behaviours are defined clearly by the static I-V curve shown in the drawings of the patent.

Canadian Pat. No. 924,390, Apr. 10, 1973 (Stanley) also teaches an electrical network having two terminals and exhibiting negative resistance characteristics. The network includes a JFET and a bipolar transistor in that the JFET controls the bias of the bipolar transistor wherein the I-V characteristics curve contains a region of negative resistance.

In a co-pending application Ser. No. 725,999 filed on Apr. 22, 1985 by the inventor of the present application, two terminal electrical networks exhibiting negative admittance are described as containing two active devices e.g. bipolar junction transistors or field-effect transistors or a combination of both, as in the networks of the above referenced patents. However, unlike the above prior patents the two terminal networks of the said pending application use two active devices which are always of opposite conductivities to each other irrespective of the kind of active devices used.

The present invention relates to an electrical network which uses one active device, i.e., bipolar junction transistor or field-effect transistor.

Unlike the patents mentioned above and the co-pending application filed by the inventor, a negative admittance is obtained without the use of positive feedback.

Instead, negative admittance is obtained by phase shifting the AC input current with respect to the AC voltage, applied to the input terminals.

Like the two terminal networks of the co-pending application the three terminal networks of the present application are very versatile in that by selecting the kinds of active devices and the choice of the various circuits components, a wide range of operating characteristics can be obtained. The three terminal networks of the present application can operate as the Esaki diode over a wide range of frequencies.

OBJECTS OF THE INVENTION

It is therefore a principal object of the present invention to provide a new electrical network which exhibits a negative admittance.

It is another object of the present invention to provide an electrical network exhibiting a negative admittance whose characteristics are easily changed.

SUMMARY OF THE INVENTION

According to the present invention, an electrical network has three terminals, an output, an input and a common terminal and exhibits a negative admittance to a high frequency AC input signal applied between the input and the commmon terminals. The network includes a transistor having an input electrode, an output electrode and a common electrode. The input terminal is connected to the input electrode of the transistor and the output terminal is coupled to the output electrode.

The common terminal and the common electrode are bridged by a phase-shift capacitor in parallel with a phase-shift resistor. This circuit provides some of the phase shifting required of the current with respect to the voltage of the input signal, to obtain a negative input admittance.

The transistor can be a bipolar junction transistor, an enhancement type MOSFET, a junction FET or a depletion MOSFET.

Various biasing schemes are also available for proper operations of the network with respect to the phase-shifting circuit.

BRIEF DESCRIPTION OF THE DRAWINGS

For a more complete understanding of the present invention and for further objects and advantages thereof, references may be made to the following description taken in conjunction with the accompanying drawings in which.

FIGS. 17(a), (b), (c) and (d) indicate typical biasing schemes.

FIGS. 19(a) and (b) are graphs indicating changes in the negative real part of the admittance as a function of the capacitance C, using either a bipolar transistor, FIG. 19(a) or a field-effect transistor, FIG. 19(b).

DETAILED DESCRIPTION OF THE PREFERRED EMBODIMENTS

Figure 1:
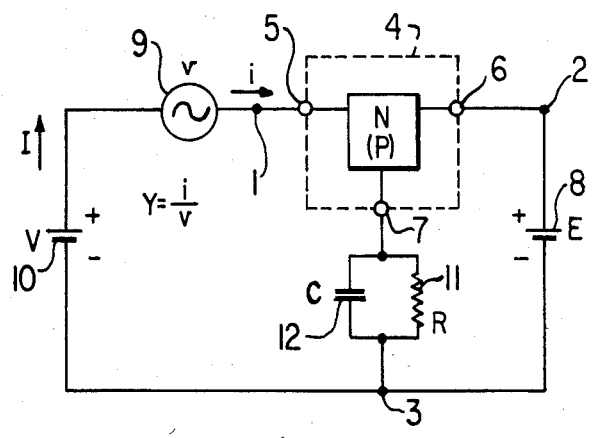
FIG. 1 is a generalized electrical network exhibiting a negative admittance according to the present invention.

FIG. 1 shows a generalized circuit diagram in which the electrical network of the present invention is schematically drawn. In the figure, the network has three terminals, an input terminal 1, and an output terminal 2, and a common terminal 3. An N type or P type transistor is used as an active device and shown at 4. The transistor 4 has three electrodes, an input electrode 5, an output electrode 6 and a common electrode 7. A power supply is shown at 8 whose polarity must be properly chosen for the type of the transistor used in the network. An AC input signal (voltage v and current i) is applied to the input terminal 1 and a suitable DC bias (voltage V and current I) is provided at 10 for proper operation of the transistor used. There are provided between the common terminal 3 and the common electrode 7, a parallel RC circuit made of a resistor 11 and a capacitor 12.

Figure 2:
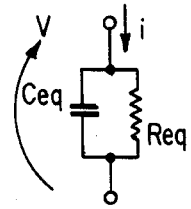
FIG. 2 is an equivalent circuit of the network shown in FIG. 1.

The circuit diagram shown in FIG. 1 can ultimately be simplified for mathematical analysis into an equivalent input circuit which is shown in FIG. 2. In the figure, $R_{eq}$ and $C_{eq}$ designate equivalent resistance and equivalent capacitance for a particular frequency $\omega$. Using the input current i and voltage v, the admittance Y of the network is expressed as:

$$Y = i/v = G + jB = 1/R_{eq} + j\omega C_{eq}$$

The transistor can be a field-effect transistor (junction FET or MOSFET) or a bipolar junction transistor. Either the N type or P type can be used.

Figure 3:
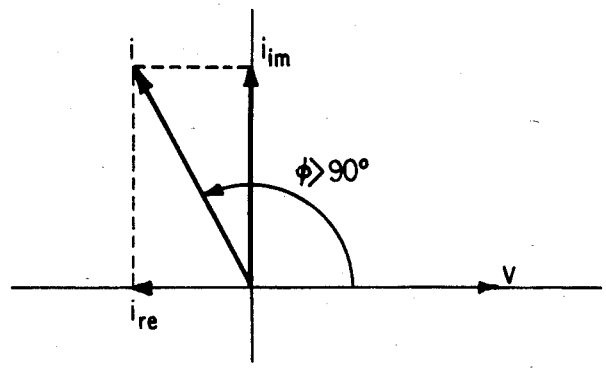
FIG. 3 is a graph showing the relationship between the current and the voltage of an AC input signal.

In either case, the essential requirement is that the active device interacts in such a way with the applied AC input signal that the resulting input current i has a relative phase angle $\phi$, with respect to the input voltage v, which is greater than 90 degrees as shown in FIG. 3. As seen in FIG. 3, the real part of the input current $i_{re}$ is 180° out-of-phase with regard to the input voltage v and a negative input conductance G results because $$G = 1/R_{eq}$$

wherein $R_{eq} = v/-i_{re}$ = negative.

For the case of the field-effect transistor, the phase-shift caused by the parallel RC circuit, appropriately dimensioned, and the phase-shift caused by interelectrode capacitors of the field-effect transistor are sufficient to obtain a relative phase-shift between input voltage and current greater than 90° and hence generate a negative real part in the input admittance.

For bipolar junction transistors the RC-circuit and the interelectrode capacitors play a similar role, however an additional phase shifting mechanism, i.e., the charge carrier diffusion delay time through the base region is required to generate a negative real part in the input admittance.

The negative admittance is therefore obtained using features which are normally considered to be limitations in the upper frequency response of both bipolar junction and field-effect transistors.

The phase-shift caused by the interelectrode and diffusion delay time is used here however to our advantage to create a negative real part in the input admittance.

Since these features are somewhat different in each active device one will obtain different results as a function of the type of active device used.

For more detailed analyses of the electrical network, a distinction is made between the low and the high frequency operations. For both the bipolar junction transistor and the field-effect transistor, the static and dynamic performance will be discussed.

The field-effect transistor networks

Figure 4:
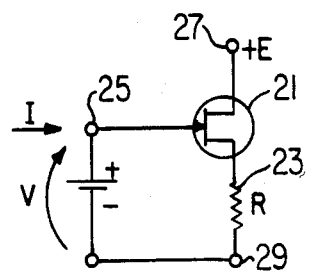
FIG. 4 is an equivalent model using a JFET operating at a low frequency.

For the low frequency operation, the electrical network of the present invention using an N channel JFET can be reduced to an equivalent model shown in FIG. 4. In the figure, the parallel RC circuit at the source of the JFET 21 is represented by a resistor 23 only because at low frequencies, the parallel capacitor has much larger reactance than the resistor and acts as an open circuit. The input terminal is at 25, the output terminal at 27 and the common terminal at 29. The input signal of low frequency having the voltage V and the current I is applied at the input terminal 25 and the supply voltag E is given at the output terminal 27.

Figure 5:
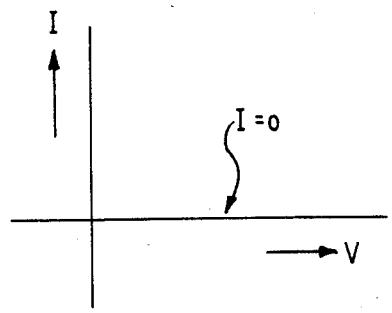
FIG. 5 is a graph showing a static I-V curve of the model shown in FIG. 4.

FIG. 5 gives a static I-V curve of the model shown in FIG. 4. The input impedance of FJET's is virtually infinite for DC and low frequencies. Hence the input current I is zero. No negative admittance is generated in this operation.

Figure 6:
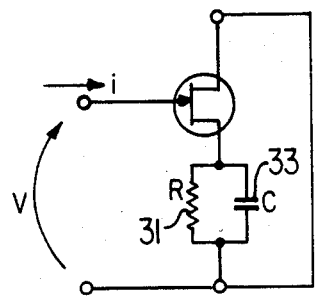
FIG. 6 is an equivalent model using a JFET operating at a high frequency.

The high frequency model is shown in FIG. 6 in which the parallel RC circuit is properly represented by the resistor (R) 31 and the capacitor (C) 33. Its equivalent small signal high frequency circuit is given in FIG. 7. The input signal of a high frequency $\omega$ has the voltage v and the current i. Various interelectrode capacitances and resistances are indicated by subscripts, such as $C_{gd}$, $C_{gs}$ and $C_{ds}$ for gate-drain, gate-source and drain source capacitances as well as $C^*_{gs}$ and $r^*_{gs}$ where $C^*_{gs}$ is the capacitance from gate to source via the channel having a series resistance $r^*_{gs}$.

The JFET has a transconductance g. It should be noted that for the following mathematical analysis, $C_{ds}$ will be included in the capacitor (C) 33 of the parallel RC circuit to simplify the equations.

Figure 7:
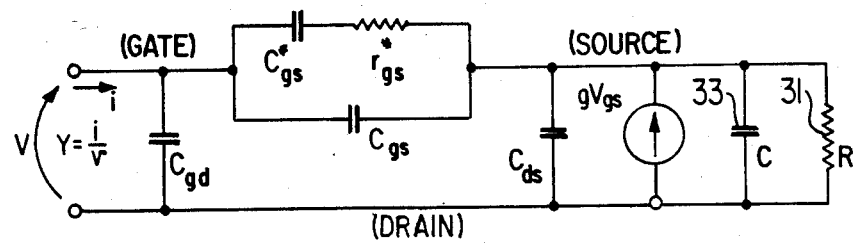
FIG. 7 is an equivalent circuit of the model shown in FIG. 6 indicating various elements for the purpose of mathematical analyses.

The circuit of FIG. 7 can be further simplified for a particlar frequency into the circuit shown in FIG. 2. Consequently the admittance Y of the network at a high operating frequency $\omega$ is expressed as $$Y = \frac{A + jB}{K + jL} = \frac{AK + BL}{K^2 + L^2} + j\frac{BK - AL}{K^2 + L^2} = \frac{1}{R_{eq}} + j\omega C_{eq}, \text{ hence}$$

$$R_{eq} = \frac{K^2 + L^2}{AK + BL} \text{ and } C_{eq} = \frac{BK - AL}{\omega(K^2 + L^2)}$$

where:

$$A = \omega^2[(C_{gs} + C_{gd})(RC^*r^*_{gs}C^*_{gs}) + RC^*_{gs}(C + C_{gd}) + RC_{gd}(C_{gs} + gr^*_{gs}C^*_{gs})]$$

$$B = \omega[C_{gs} + C^*_{gs} + C_{gd} + gRC_{gd} - \omega^2 Rr^*_{gs}C^*_{gs}\{C(C_{gs} + C_{gd}) + C_{gd}C_{gs}\}]$$

-continued
$$K = [1 + gR - \omega^2 R r^*_{gs} C^*_{gs}(C + C_{gs})]$$

$$L = \omega[r^*_{gs} C^*_{gs} + R(C + C^*_{gs} + C_{gs} + g r^*_{gs} C^*_{gs})]$$

Figure 8:
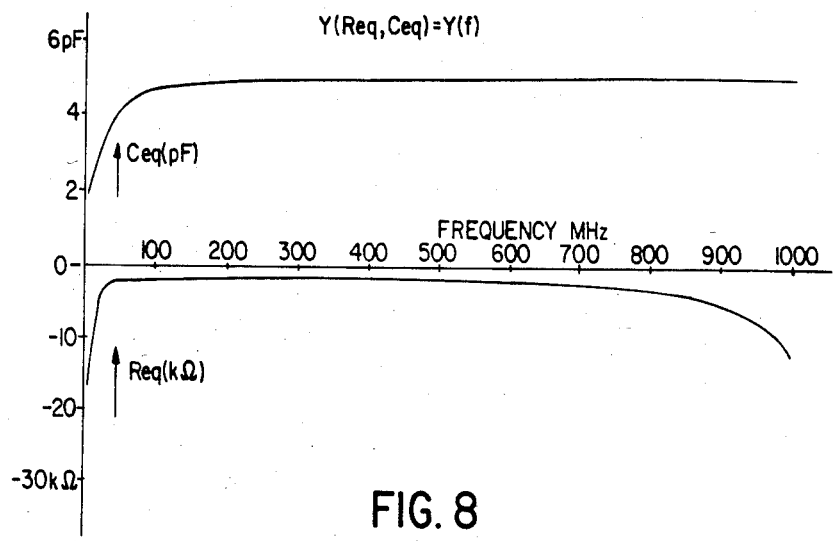
FIG. 8 gives graphs showing equivalent resistance $R_{eq}$ and equivalent capacitance $C_{eq}$ of the equivalent circuit shown in FIG. 7 plotted against frequency.

In FIG. 8, graphs show $R_{eq}$ and $C_{eq}$ as a function of frequency f ($\omega = 2\pi f$) up to 1 GHz for a network using a 2N3823 junction JFET. The parallel RC circuit is made of R=20 KΩ and C=10 pF. The other values in FIG. 7 for the 2N3823 are $C_{gs}=4$ pF, $C^*_{gs}=2$ pF, $C_{gd}=1.5$ pF $C_{ds}=2$ pF, $r^*_{gs}=10\Omega$ and $g=3\times10^{-3}$ mhos. As can be seen in FIG. 8, $R_{eq}$ is negative indicating that a negative admittance Y is created.

Figure 9:
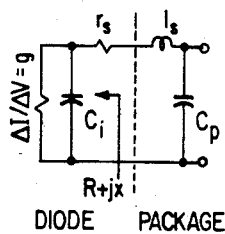
FIG. 9 shows an equivalent circuit of a typical tunnel diode.
Figure 10:
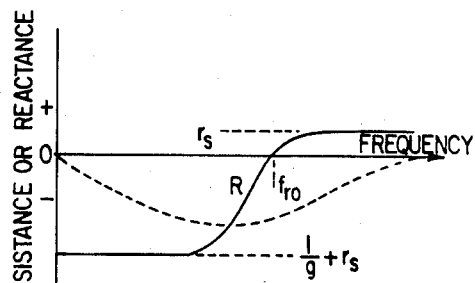
FIG. 10 is a graph indicating the terminal impedance of the tunnel diode shown in FIG. 9 as a function of the operating frequency.

For a comparison, FIGS. 9 and 10 give an equivalent circuit of a typical tunnel diode and its terminal impedance. As seen in the figures the terminal negative resistance exists for all frequencies from DC up to a frequency $f_{ro}$, this being from 1 to 30 GHz depending on the particular diode construction.

THE BIPOLAR JUNCTION TRANSISTOR NETWORK

Now the electrical network of the present invention using a bipolar junction transistor is discussed.

Figures 11, 12:
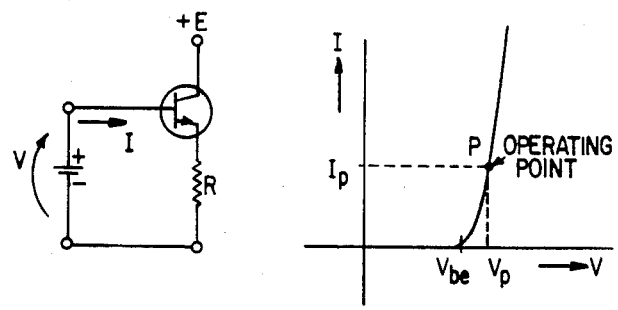
FIG. 11 is an equivalent model using a bipolar junction transistor operating at a low frequency.
FIG. 12 is a graph showing a static I-V curve of the model shown in FIG. 11.

As in FIGS. 4 and 5, FIGS. 11 and 12 show, respectively, a low frequency model and its static I-V curve. The input admittance consists of a positive resistance equal to the resistance R multiplied by current gain h of the transistor. As seen in FIG. 12, the transistor operating at point p (voltage $V_p$ and current $I_p$) in the network creates the admittance $Y=1/hR$=positive for $V_p > V_{bc}$ and zero for $V_p < V_{bc}$.

Consequently, no negative admittance is generated in this operation.

Figure 13:
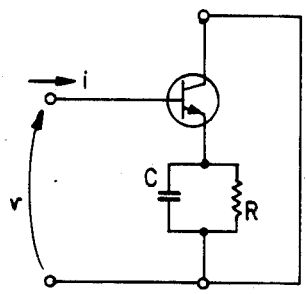
FIG. 13 is an equivalent model using a bipolar junction transistor operating at a high frequency.
Figure 14:
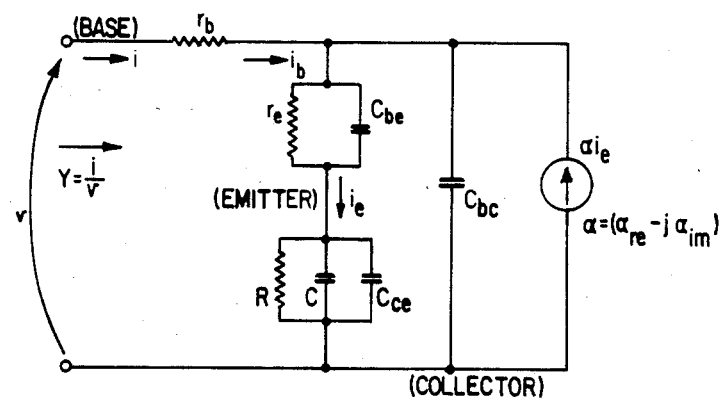
FIG. 14 is an equivalent circuit of the model shown in FIG. 13 indicating various elements for the purpose of mathematical analysis.

The high frequency model and its small signal equivalent circuit are shown in FIGS. 13 and 14. As in the case of JFET, interelectrode capacitances and resistances are indicated by subscripts. It is also noted that the current i.e. of the bipolar transistor is complex to account for the transit time delay for charge carriers to diffuse through the base region. The collector-emitter capacitance, $C_{ce}$, is very small and will be treated as forming part of the capacitance C of the parallel RC circuit in the following analysis.

For any particular frequency, the circuit shown in FIG. 2 can be equated for analysis. Therefore as in the case of JFET, the following equations derived $$Y = \frac{A + jB}{K + jL} = \frac{AK + BL}{K^2 + L^2} + j\frac{BK - AL}{K^2 + L^2}$$

$$= \frac{1}{R_{eq}} + j\omega C_{eq}, \text{ hence}$$

$$R_{eq} = \frac{K^2 + L^2}{AK + BL} \text{ and } C_{eq} = \frac{K^2 + L^2}{\omega(BK - AL)} \text{ where,}$$

$$A = 1 - a_{re} - (a_{im} + \omega R C_{bc})\omega r_e C_{be} -$$

$$\left\{ a_{im} + \left(1 - a_{re} + \frac{C_{bc}}{C_{be}}\right) \omega r_e C_{be} \right\} \omega R C$$

$$B = a_{im} + \left\{ 1 - a_{re} + \left(1 + \frac{R}{r_e}\right) \frac{C_{bc}}{C_{be}} \right\} \omega r_e C_{be} +$$

-continued
$$\{1 - a_{re} - a_{im}\omega r_e C_{be}\}\omega RC$$

$$K = r_e + R + r_b\left[1 - a_{re} - (a_{im} + \omega R C_{bc})\omega r_e C_{be} - \right.$$

$$\left\{ a_{im} + \left(1 - a_{re} + \frac{C_{bc}}{C_{be}}\right) \omega r_e C_{be} \right\} \omega R C \Bigg]$$

$$L = (C_{be} + C)\omega r_e R + r_b\left[ a_{im} + \left\{ 1 - a_{re} + \right. \right.$$

$$\left. \left(1 + \frac{R}{r_e}\right) \frac{C_{bc}}{C_{be}} \right\} \omega r_e C_{be} + \{1 - a_{re} - a_{im}\omega r_e C_{be}\}\omega RC \Bigg]$$

Figure 15:
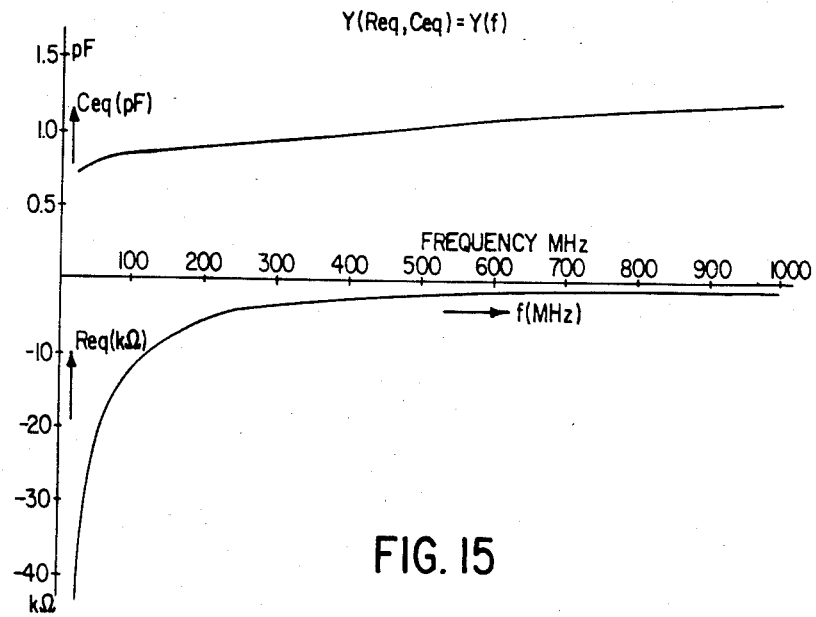
FIG. 15 gives graphs showing equivalent resistance $R_{eq}$ and equivalent capacitance $C_{eq}$ of the equivalent circuit shown in FIG. 14 plotted against frequency.

Graphs in FIG. 15 show $R_{eq}$ and $C_{eq}$ over a frequency range of 1 GHz for the following circuit parameters of the microwave transistor MMBR901:

$$I = 50 \mu A \rightarrow r_e = 500\Omega; r_b = 10\Omega$$

$$C_{be} = 1pF \quad C_{bc} = .4pF$$

$$C = 10pF \quad C + C_{ce} = 10pF \quad R = 15K\Omega$$

$$a = \frac{a_o}{1 + j\frac{1.7f}{f_T}} = a_{re} - ja_{im} \text{ where } a_o = 0.98 \text{ and}$$

$$f_T = 1GHz \text{ for } I_e = 50 \mu A$$

Figure 16:
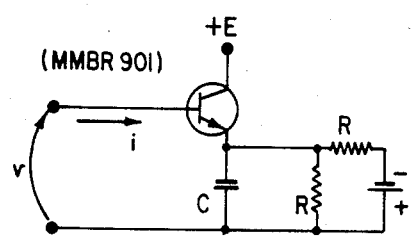
FIG. 16 is a circuit diagram using a transistor MMBR901 for which the graphs of FIG. 15 are obtained.

It is to be noted that the MMBR901 requires a DC bias. Various schemes for biasing the transistor are possible and will be discussed below. The network shown in FIG. 16 uses emitter voltage biasing and the graphs shown in FIG. 15 are obtained using this network.

The above preferred embodiment has been operated at low current levels e.g. 50 to 100 μA. A microwave bipolar junction transistor, such as the MMBR901 will give a negative admittance throughout the VHF and UHF bands. In the upper MF and HF bands, a 2N3904 type transistor can be used to obtain a negative input admittance.

BIASING SCHEMES

The DC-biasing, as shown in FIG. 1, is valid for active devices such as bipolar junction transistors and field-effect transistors. Junction FET's and Depletion MOSFET's however have a negative pinch-off voltage $V_p$, hence can be operated self-biasing and the biasing voltage V can therefore be reduced to zero. The biasing, for various active devices, is illustrated in FIG. 17.

A bipolar junction transistor is shown in FIG. 17(a) and field-effect transistors are in FIGS. 17(b), (c), and (d).

For bipolar junction transistors two other types of biasing have been used: current biasing at the base and voltage biasing on the emitter side.

Figure 18A:
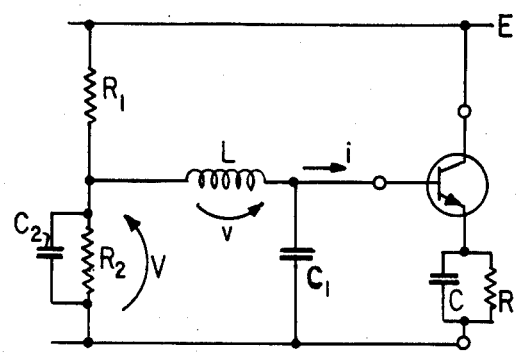
FIGS. 18(a), (b), and (c) show various biasing schemes used for an NPN bipolar junction transistor operating in an oscillation circuit.

The three biasing methods with bipolar junction transistors are illustrated in FIGS. 18(a), (b) and (c), where the negative admittance is shown in an actual oscillator circuit. The capacitance $C_1$, with the inductance L, shown in each of FIGS. 18(a), (b) and (c) forms a resonance tank circuit. The negative admittance Y sustains a stable sinusoidal oscillation at the resonance frequency.

The small signal input parameters v and i are shown over the inductance in FIGS. 18(a), (b), and (c).

In FIG. 18(a) where a base voltage biasing is illustrated, the DC bias is created by a voltage divider made of resistors R₁ and R₂. Capacitor C₂ is a bypass capacitor. The bias voltage V is therefore expressed as:

$$V = \frac{R_2}{R_1 + R_2} E$$

Figure 18B:
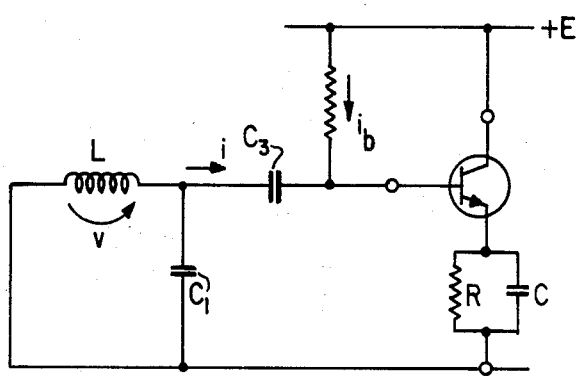
Figure 18C:
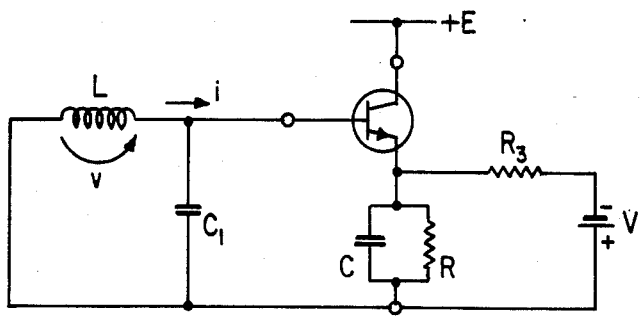

FIG. 18(b) discloses a base current biasing. As in FIG. 18(a), C₃ is a bypass capacitor. An emitter voltage biasing is shown in FIG. 18(c), wherein R₃ is a bias resistor and the bias voltage is generated by a battery shown therein.

The three-terminal negative admittance network of the present invention is a very versatile device:

(1) The negative real part of the admittance can be used both to sustain oscillation as well as to increase Q-factor of a resonance tank circuit.

(2) The imaginary part (susceptance) of the admittance can be used as a capacitor to form, with an external inductance, a resonance tank circuit.

(3) The collector-base capacitor $C_{bc}$ of a bipolar junction transistor and the drain-gate capacitor $C_{dg}$ of a JFET can be used as a variable capacitor by varying the collector/drain supply voltage and hence controlling the resonance frequency of a tank circuit (voltage controlled oscillator).

(4) The non-linear behaviour of the base-emitter I-V curve and the non-linear transconductance curve of a field-effect transistor can be used for rectification and frequency mixing.

(5) The inherent gain of a bipolar transistor or field-effect transistor can be used for amplifying from the input terminal a-b to the output terminal c.

(6) Replacing the capacitor C by a trimmer capacitor allows very smooth control of the negative real part of the negative admittance. FIGS. 19(a) and (b) are graphs indicating changes in the negative real part against the capacitance for a microwave transistor and a junction FET respectively.

TYPICAL APPLICATIONS FOR THREE TERMINAL NEGATIVE ADMITTANCE NETWORK

The most obvious application for the two-terminal negative admittance is that of oscillators, where the negative admittance is shunted over a suitable resonance circuit as shown in FIG. 18.

An important specific area of application is that of marginal oscillator measuring schemes.

A marginal oscillator is characterized by the feature that its amplitude compliance coefficient is very large. Therefore, minute changes of parameters, which can be coupled into the oscillator via the magnetic field of its inductor on the electric field of its capacitor, can readily change the amplitude of the oscillator.

This specialized measuring scheme, using marginal oscillators, can be made very sensitive.

For example, a marginal oscillator detection scheme is used to measure minute changes in the magnetic susceptibility, of a sample placed inside the coil, in nuclear spin resonance spectrometers.

Other examples of marginal oscillator measuring schemes are: grid dip meters, metal detectors, measuring changes in the dielectric filling of the capacitor.

The "Three-terminal negative admittance" is very suitable for marginal oscillator measuring schemes, primarily for three reasons:

(1) The negative conductance can readily be adjusted to just barely overcome the internal losses of the resonance circuit.

(2) The non linearity in the negative conductance can be kept very small as well as smooth, for small amplitudes of oscillation. This results in a very large amplitude compliance coefficient, typical for marginal oscillators.

(3) The third terminal of the negative admittance network allows flexibility in a variety of circuit configurations.

I claim:

1. An electrical network having an input terminal, an output terminal and a common terminal and exhibiting a negative admittance to a high frequency AC input signal applied between the input terminal and the common terminal, comprising:

a transistor having an input electrode, an output electrode and a common electrode, the input terminal connected to the input electrode to apply the high frequency AC input signal to the input electrode of the transistor, the output terminal coupled with the output electrode of the transistor, phase shift means comprising phase shift resistors and phase shift capacitors and bridging the common electrode and the common terminal so that there is created a phase-shift between the current and the voltage of the AC input signal and the said resistors and the said capacitors are chosen as to their values to produce the phase-shift of more than 90° between the said current and the said voltage.

2. The electrical network of claim 1 wherein the transistor is a bipolar junction transistor having a base, a collector and an emitter as the input, the output and the common electrodes respectively, DC bias means is provided on the electrodes of the transistor for biasing the said electrodes with respect to each other, and the phase shift means comprises a resistor and a capacitor connected in parallel between the common terminal and the common electrode.

3. The electrical network of claim 2 wherein the bipolar junction transistor is of the NPN type and has a base, a collector and an emitter as the input, the output and the common electrodes respectively.

4. The electrical network of claim 3 wherein the DC bias means comprises a voltage divider provided between the collector and the common terminal to generate a bias voltage which is applied to the base.

5. The electrical network of claim 3 wherein the DC bias means comprises a bias resistor forming a current path between a power supply and the base.

6. The electrical network of claim 3 wherein the DC bias means comprises a bias voltage source coupled between the emitter and the common terminal.

7. The electrical network of claim 1 wherein the transistor is an enhancement type MOSFET having a gate, a drain and a source as the input, the output and the common electrodes respectively, DC bias means comprising a bias voltage source is provided between the gate and the common terminal and the phase shift means comprises a resistor and a capacitor connected in parallel between the common terminal and the source.

8. The electrical network of claim 1 wherein the transistor is of a type selected from a group consisting of a junction FET and a depletion MOSFET having a gate, a drain and a source as the input, the output and the common electrodes respectively and the phase shift means comprises a resistor and a capacitor connected in parallel between the common terminal and the source.

9. The electrical network of claim 7 wherein the phase shift means comprises a resistor and a variable capacitor connected in parallel between the common terminal and the source.

10. The electrical network of claim 8 wherein the phase shift means comprises a resistor and a variable capacitor connected in parallel between the common terminal and the source.

11. The electrical network of claim 3 wherein the phase shift means comprises a resistor and a variable capacitor connected in parallel between the common terminal and the emitter.

* * * * *